(12) United States Patent
Gaff et al.

(10) Patent No.: US 8,461,674 B2
(45) Date of Patent: Jun. 11, 2013

(54) THERMAL PLATE WITH PLANAR THERMAL ZONES FOR SEMICONDUCTOR PROCESSING

(75) Inventors: Keith William Gaff, Fremont, CA (US); Keith Comendant, Fremont, CA (US); Anthony Ricci, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/238,396

(22) Filed: Sep. 21, 2011

(65) Prior Publication Data

US 2013/0072035 A1 Mar. 21, 2013

(51) Int. Cl.
*H01L 23/48* (2006.01)
*H01L 23/52* (2006.01)

(52) U.S. Cl.
USPC .......... 257/690; 257/678; 257/692; 257/100; 257/14; 257/45; 438/26; 438/415; 438/133; 438/542

(58) Field of Classification Search
USPC ............ 257/690, 678, 692, 100, 14, 45, 703, 257/162, 697; 438/26, 415, 133, 542
See application file for complete search history.

(56) References Cited

U.S. PATENT DOCUMENTS

| | | |
|---|---|---|
| 3,440,883 A | 4/1969 | Lightner |
| 5,255,520 A | 10/1993 | O'Geary et al. |
| 5,414,245 A | 5/1995 | Hackleman |
| 5,504,471 A | 4/1996 | Lund |
| 5,515,683 A | 5/1996 | Kessler |
| 5,536,918 A | 7/1996 | Ohkase et al. |
| 5,635,093 A | 6/1997 | Arena et al. |
| 5,665,166 A | 9/1997 | Deguchi et al. |
| 5,667,622 A | 9/1997 | Hasegawa et al. |
| 5,740,016 A | 4/1998 | Dhindsa |
| 5,802,856 A | 9/1998 | Schaper et al. |
| 5,851,298 A | 12/1998 | Ishii |
| 5,886,866 A | 3/1999 | Hausmann |
| 6,060,697 A | 5/2000 | Morita et al. |
| 6,095,084 A | 8/2000 | Shamouilian et al. |
| 6,175,175 B1 | 1/2001 | Hull |
| 6,222,161 B1 | 4/2001 | Shirakawa et al. |

(Continued)

FOREIGN PATENT DOCUMENTS

| | | |
|---|---|---|
| JP | 2005123286 A | 5/2005 |
| JP | 2005294237 A | 10/2005 |
| KR | 20080058109 A | 6/2008 |

OTHER PUBLICATIONS

Commonly-Owned U.S. Appl. No. 12/910,347, filed Oct. 22, 2010.

(Continued)

*Primary Examiner* — Telly Green
(74) *Attorney, Agent, or Firm* — Buchanan Ingersoll & Rooney PC

(57) ABSTRACT

A thermal plate for a substrate support assembly in a semiconductor plasma processing apparatus, comprises multiple independently controllable planar thermal zones arranged in a scalable multiplexing layout, and electronics to independently control and power the planar heater zones. Each planar thermal zone uses at least one Peltier device as a thermoelectric element. A substrate support assembly in which the thermal plate is incorporated includes an electrostatic clamping electrode layer and a temperature controlled base plate. Methods for manufacturing the thermal plate include bonding together ceramic or polymer sheets having planar thermal zones, positive, negative and common lines and vias.

18 Claims, 5 Drawing Sheets

U.S. PATENT DOCUMENTS

| | | |
|---|---|---|
| 6,271,459 B1 | 8/2001 | Yoo |
| 6,353,209 B1 | 3/2002 | Schaper et al. |
| 6,475,336 B1 | 11/2002 | Hubacek |
| 6,512,207 B1 | 1/2003 | Dress et al. |
| 6,523,493 B1 | 2/2003 | Brcka |
| 6,566,632 B1 | 5/2003 | Katata et al. |
| 6,664,515 B2 | 12/2003 | Natsukata et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,795,292 B2 | 9/2004 | Grimard et al. |
| 6,825,617 B2 | 11/2004 | Kanno et al. |
| 6,847,014 B1 | 1/2005 | Benjamin et al. |
| 6,886,347 B2 | 5/2005 | Hudson et al. |
| 6,921,724 B2 | 7/2005 | Kamp et al. |
| 6,989,210 B2 | 1/2006 | Gore |
| 7,075,031 B2 | 7/2006 | Strang et al. |
| 7,141,763 B2 | 11/2006 | Moroz |
| 7,175,714 B2 | 2/2007 | Ootsuka et al. |
| 7,230,204 B2 | 6/2007 | Mitrovic et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 | 8/2008 | Barnett, Jr. et al. |
| 7,475,551 B2 | 1/2009 | Ghoshal |
| 7,504,006 B2 | 3/2009 | Gopalraja et al. |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 2002/0043528 A1 | 4/2002 | Ito |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0191637 A1 | 8/2006 | Zajac et al. |
| 2007/0125762 A1 | 6/2007 | Cui et al. |
| 2008/0029195 A1 | 2/2008 | Lu |
| 2008/0049374 A1 | 2/2008 | Morioka et al. |
| 2008/0202924 A1 | 8/2008 | Bluck et al. |
| 2009/0000738 A1 | 1/2009 | Benjamin |
| 2009/0173445 A1 | 7/2009 | Yeom et al. |
| 2009/0183677 A1 | 7/2009 | Tian et al. |
| 2010/0078424 A1 | 4/2010 | Tsukamoto et al. |
| 2010/0257871 A1 | 10/2010 | Venkatasubramanian et al. |
| 2011/0092072 A1* | 4/2011 | Singh et al. .................. 438/710 |
| 2011/0143462 A1 | 6/2011 | Gaff et al. |

OTHER PUBLICATIONS

Commonly-Owned U.S. Appl. No. 12/943,492, filed Nov. 10, 2010.
Commonly-Owned U.S. Appl. No. 13/237,444, filed Sep. 20, 2011.
Commonly-Owned U.S. Appl. No. 13/234,473, filed Sep. 16, 2011.
Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.
International Search Report and Written Opinion mailed Feb. 1, 2013 for PCT/IB12/54903.

* cited by examiner

THERMAL PLATE WITH PLANAR THERMAL ZONES FOR SEMICONDUCTOR PROCESSING

BACKGROUND OF THE DISCLOSURE

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non-plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

SUMMARY OF THE INVENTION

A thermal plate, configured to overlay a temperature controlled base plate of a substrate support assembly used to support a semiconductor substrate in a semiconductor processing apparatus, the thermal plate comprises an electrically insulating plate, planar thermal zones comprising at least first, second, third and fourth planar thermal zones. Each planar thermal zone comprises one or more Peltier devices as thermoelectric elements, the planar thermal zones laterally distributed across the electrically insulating plate and operable to tune a spatial temperature profile on the substrate, positive voltage lines comprising first and second electrically conductive positive voltage lines laterally distributed across the electrically insulating plate, negative voltage lines comprising first and second electrically conductive negative voltage lines laterally distributed across the electrically insulating plate, common lines comprising first and second electrically conductive common lines laterally distributed across the electrically insulating plate, first, second, third, fourth, fifth, sixth, seventh and eighth diodes laterally distributed across the electrically insulating plate.

An anode of the first diode is connected to the first positive voltage line and a cathode of the first diode is connected to the first planar thermal zone. An anode of the second diode is connected to the first planar thermal zone and a cathode of the second diode is connected to the first negative voltage line. An anode of the third diode is connected to the first positive voltage line and a cathode of the third diode is connected to the second planar thermal zone. An anode of the fourth diode is connected to the second planar thermal zone and a cathode of the fourth diode is connected to the first negative voltage line. An anode of the fifth diode is connected to the second positive voltage line and a cathode of the fifth diode is connected to the third planar thermal zone. An anode of the sixth diode is connected to the third planar thermal zone and a cathode of the sixth diode is connected to the second negative voltage line. An anode of the seventh diode is connected to the second positive voltage line and a cathode of the seventh diode is connected to the fourth planar thermal zone. An anode of the eighth diode is connected to the fourth planar thermal zone and a cathode of the eighth diode is connected to the second negative voltage line. The first common line is connected to both the first and third planar thermal zones. The second common line is connected to both the second and fourth planar thermal zones.

DETAILED DESCRIPTION

Figure 1:
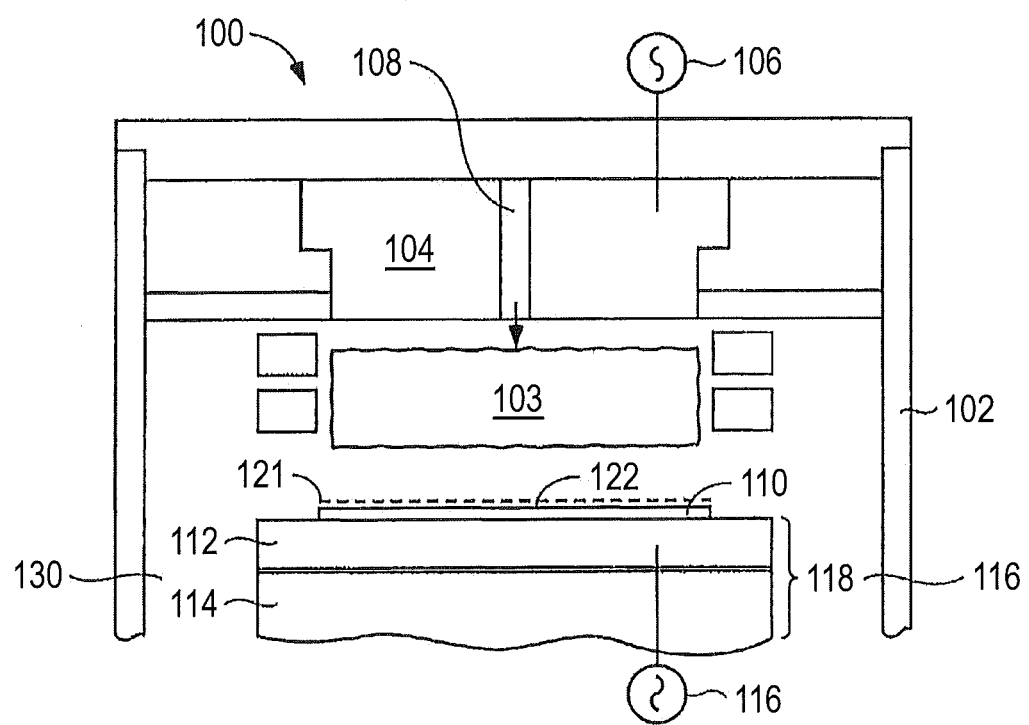
FIG. 1 is a schematic of an exemplary plasma processing chamber, which can include a substrate support assembly with a thermal plate described herein.

Radial and azimuthal substrate temperature control in a semiconductor processing apparatus to achieve desired critical dimension (CD) uniformity on the substrate is becoming more demanding. Even a small variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise an upper substrate holder, a lower fluid-cooled heat sink (hereafter referred to as cooling plate) and a plurality of concentric planar heater zones therebetween to realize step by step and radial temperature control. The heaters can maintain the support surface of the substrate support assembly at temperatures about 0° C. to 80° C. above the cooling plate temperature. By changing the heater power within the plurality of planar heater zones, the substrate support temperature profile can be changed. Further, the mean substrate support temperature can be changed step by step within the operating range of 0 to 80° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In light of the complex nature of temperature control, it would be advantageous to incorporate multiple independently controllable planar thermal zones in the substrate support assembly to enable the apparatus to actively create and maintain the desired spatial and temporal temperature profile, and to compensate for other adverse factors that affect CD uniformity.

A heating plate for a substrate support assembly in a semiconductor processing apparatus with multiple independently controllable planar heater zones is disclosed in commonly-owned U.S. Patent Publication Nos. 2011/0092072 and 2011/0143462, the disclosure of which is hereby incorporated by reference. This heating plate comprises a scalable multiplexing layout scheme of the planar heater zones and conductor lines for providing power to the planar heater zones. By tuning the power of the planar heater zones, the temperature profile during processing can be shaped both radially and azimuthally.

Described herein is a thermal plate for a substrate support assembly in a semiconductor processing apparatus, wherein the thermal plate has multiple independently controllable planar thermal zones each of which includes at least one thermoelectric element, e.g., a single Peltier device or module containing plurality of Peltier devices connected in series and coupled to upper and lower plates which are heated or cooled depending on the direction of current flow. Preferably, the planar thermal zones do not have resistive heater elements. It should be appreciated that a primary heater with one or more resistive heater elements can be incorporated in the substrate support assembly for mean temperature control.

The planar thermal zones are preferably arranged in a defined pattern, for example, a rectangular grid, a hexagonal grid, a polar array, concentric rings or any desired pattern. Each planar thermal zone may be of any suitable size and may have one or more thermoelectric elements. When a planar thermal zone is powered, all thermoelectric elements therein are powered; when a planar thermal zone is not powered, all thermoelectric elements therein are not powered. To minimize the number of electrical connections while enabling the capability of both heating and cooling using Peltier devices in the planar thermal zones, negative, positive and common lines are arranged such that each positive voltage line is connected to a different group of planar thermal zones, and has a corresponding negative voltage line connected to the same group of planar thermal zones as the positive voltage line is connected to, and each common line is connected to a different group of planar thermal zones such that no two planar thermal zones are connected to the same pair of positive and negative voltage lines and the same common line. Thus, a planar thermal zone can be activated by directing electrical current through a positive voltage line or its corresponding negative voltage line, and a common line to which this particular planar thermal zone is connected.

The power of the thermoelectric elements is preferably smaller than 20 W, more preferably 5 to 10 W. In one embodiment, each planar thermal zone is not larger than four device dies being manufactured on a semiconductor substrate, or not larger than two device dies being manufactured on a semiconductor substrate, or not larger than one device die being manufactured on a semiconductor substrate, or from 16 to 100 $cm^2$ in area, or from 1 to 15 $cm^2$ in area, or from 2 to 3 $cm^2$, or 0.1 to 1 $cm^2$ in area to correspond to the device dies on the substrate. The thickness of the thermoelectric elements may range from 1 millimeter to 1 centimeter.

The thermal plate can include any suitable number of planar thermal zones, such as 16 to 400 planar thermal zones. To allow space between planar thermal zones and/or positive voltage lines, negative voltage lines and common lines, the total area of the planar thermal zones may be 90% of the area of the upper surface of the substrate support assembly, e.g. 50-90% of the area. In other embodiments, the planar thermal zones may take up to 95% or 98% of the area. The planar thermal zones may be 100% of the area. The positive voltage lines, the negative voltage lines or the common lines (conductor lines, collectively) may be arranged in gaps ranging from 1 to 10 mm between the planar thermal zones, or in separate planes separated from the planar thermal zones plane by electrically insulating layers. The conductor lines are preferably made as wide as the space allows, in order to carry large current and reduce Joule heating. In one embodiment, in which the conductor lines are in the same plane as the planar thermal zones, the width of the conductor lines is preferably between 0.3 mm and 2 mm. In another embodiment, in which the conductor lines are on different planes than the planar thermal zones, the width of the conductor lines can be 0.3 to 2 nm wide or up to the width of the planar thermal zones, e.g. for a 300 mm chuck, the width can be up to 1 to 2 inches. Preferably, the materials of the conductor lines are materials with low resistivity, such as Cu, Al, W, Inconel® or Mo.

Thermoelectric elements provide an advantage over similarly sized heating elements, for example, with an array of small resistance heaters (e.g., less then 2 cm in width), thermal crosstalk among neighboring planar thermal zones can be severe, which limits the ability of the thermal plate to create a temperature profile with a high spatial frequency and/or to provide a wide tunable temperature range. Peltier devices as thermoelectric elements can compensate for the thermal crosstalk because, unlike conventional resistive heater elements, Peltier devices can both heat and cool. Using Peltier devices as thermoelectric elements thus can provide more flexibility, a wider tunable temperature range and the ability to generate a temperature profile with a high spatial frequency.

FIG. 1 illustrates a plasma reactor 100 in accordance with one embodiment. The plasma reactor 100 generally includes a process chamber 102 within which a plasma 103 can be ignited and sustained for processing. Inside the chamber 102 there is generally disposed an upper electrode 104, which may be coupled to a first RF power supply 106 via a matching network (not shown). First RF power supply 106 is generally configured to supply upper electrode 104 with RF energy. A gas inlet 108 is provided within the upper electrode 104 for introducing process gas, e.g., etchant gases, into an active region between the upper electrode 104 and the substrate 110. The process gas may also be introduced into chamber 102 by various types of gas supply arrangements such as a gas injector, gas distribution plate (e.g., showerhead), one or more gas rings and/or other suitable arrangement. In the illustrated embodiment, the process chamber 102 is arranged to be substantially cylindrical in shape, and the chamber walls are arranged to be substantially vertical. It should be understood, however, that various configurations of the process chamber and internal components, including the chamber walls, may be used.

Substrate 110 can be introduced into chamber 102 and disposed on substrate support 112, which acts as a substrate support and optionally, in a preferred embodiment, comprises a lower electrode. Substrate support 112 comprises an upper portion of heat transfer system 118. Heat transfer member 114 comprises a lower portion of heat transfer system 118. Preferably the substrate support is in good thermal contact with the heat transfer member 114. A layer of adhesive such as a silicone adhesive can be used to bond the substrate support 112 to the heat transfer member 114. The substrate support 112 can also be attached to the heat transfer 114 member using other joining techniques such as soldering or brazing. Heat transfer system 118, including heat transfer member 114 and substrate support 112 will be described in greater detail below.

Substrate 110 represents a work-piece to be processed, which may be, for example, a semiconductor wafer. In addition to a semiconductor wafer, the substrate can comprise a glass panel to be processed into a flat panel display. The substrate 110 can comprise one or more layers to be removed (etched) during processing or, alternatively, the processing can comprise forming one or more layers on the substrate.

An exhaust port 130 is preferably disposed between the walls of the chamber 102 and the heat transfer system 118. The exhaust port 130 is configured for exhausting gases formed during processing, and is generally coupled to a turbomolecular pump (not shown), located outside of the process chamber 102. In most embodiments, the turbomolecular pump is arranged to maintain the appropriate pressure inside the process chamber 102. Although the exhaust port is shown disposed between the chamber walls and the substrate support, the actual placement of the exhaust port may vary according to the specific design of the plasma processing system. For example, gases may also be exhausted from ports built into the walls of the process chamber. In addition, a plasma confinement ring assembly may be disposed inside process chamber 102 between the upper electrode 104 and the substrate support 112 to confine the plasma 103 above the substrate 110. See, for example, commonly-owned U.S. Pat. Nos. 5,534,751, 5,569,356 and 5,998,932, the contents of which are hereby incorporated by reference in their entirety.

In order to generate plasma 103, a process gas is typically supplied into process chamber 102 through gas inlet 108. Subsequently, when one or both of the RF power supplies are energized, an electric field is inductively or capacitively coupled inside the process chamber through one or both of the RF electrodes.

It should be noted that although the plasma reactor 100 is described in detail, the heat transfer system itself is not limited to any particular type of substrate processing apparatus and may be adapted for use in any of the known substrate processing systems, including but not limited to those adapted for etching processes, including those adapted for dry etching, plasma etching, reactive ion etching (RIE), magnetically enhanced reactive ion etching (MERIE), electron cyclotron resonance (ECR) or the like. A plasma processing reactor can comprise a parallel plate etch reactor such as the dual frequency plasma etch reactor described in commonly-owned U.S. Pat. No. 6,090,304, the disclosure of which is hereby incorporated by reference. Furthermore, the heat transfer system may be used in any of a number of deposition processes, including those adapted for chemical vapor deposition (CVD), plasma enhanced chemical vapor deposition (PECVD), and physical vapor deposition (PVD) such as sputtering. The heat transfer system may be used in an ion implantation apparatus.

Further still, it is contemplated that the heat transfer system may be practiced in any of the above reactors, as well as other suitable plasma processing reactors irrespective of whether energy to the plasma is delivered through direct current plasma sources, capacitively coupled parallel electrode plates, ECR microwave plasma sources, or inductively coupled RF sources such as helicon, helical resonators, and RF antennas (planar or non-planar). Suitable plasma generating equipment is disclosed in commonly-owned U.S. Pat. No. 4,340,462 (parallel plate), U.S. Pat. No. 5,200,232 (ECR), and U.S. Pat. No. 4,948,458 (inductively coupled), the contents of which are incorporated herein by reference in their entirety.

Figure 2:
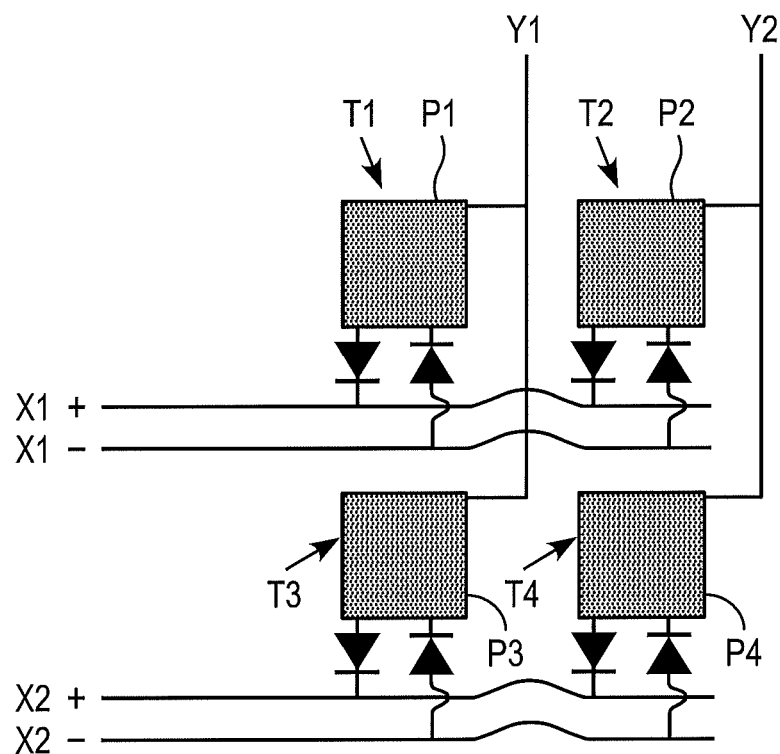
FIG. 2 illustrates the electrical connection of positive, negative and common lines to Peltier devices in a thermal plate which can be incorporated in a substrate support assembly.

FIG. 2 is a schematic of a thermal array wherein only four thermal zones T1, T2, T3, T4 are shown to illustrate connections to Peltier devices P1, P2, P3, P4, conductor lines Y1 and Y2 represent common lines and conductor lines $X1^+$ and $X2^+$ illustrate positive voltage lines. Lines $X1^-$ and $X2^-$ illustrate negative voltage lines. By supplying positive or negative voltage to lines $X1^+$, $X2^+$, $X1^-$, $X2^-$ and turning on a common line Y1, Y2, it is possible to heat or cool an upper surface of a P1, P2, P3, P4. For example, by supplying positive voltage via $X1^+$ and turning on line Y1, P1 can be activated to heat a zone T1 above P1. Alternatively, $X1^+$ can be turned off and $X1^-$ turned on to cool zone T1 above P1. The thermal array of thermoelectric elements can be an n by n grid (e.g., 4×4, 5×5, 6×6, 7×7, 8×8, 9×9, 10×10, etc.), an n by m grid (e.g., 4×5, 6×9, 12×15, etc.) or other arrangement with thermal zones of the same or different shape and the same or different cross-sectional area.

Figure 3:
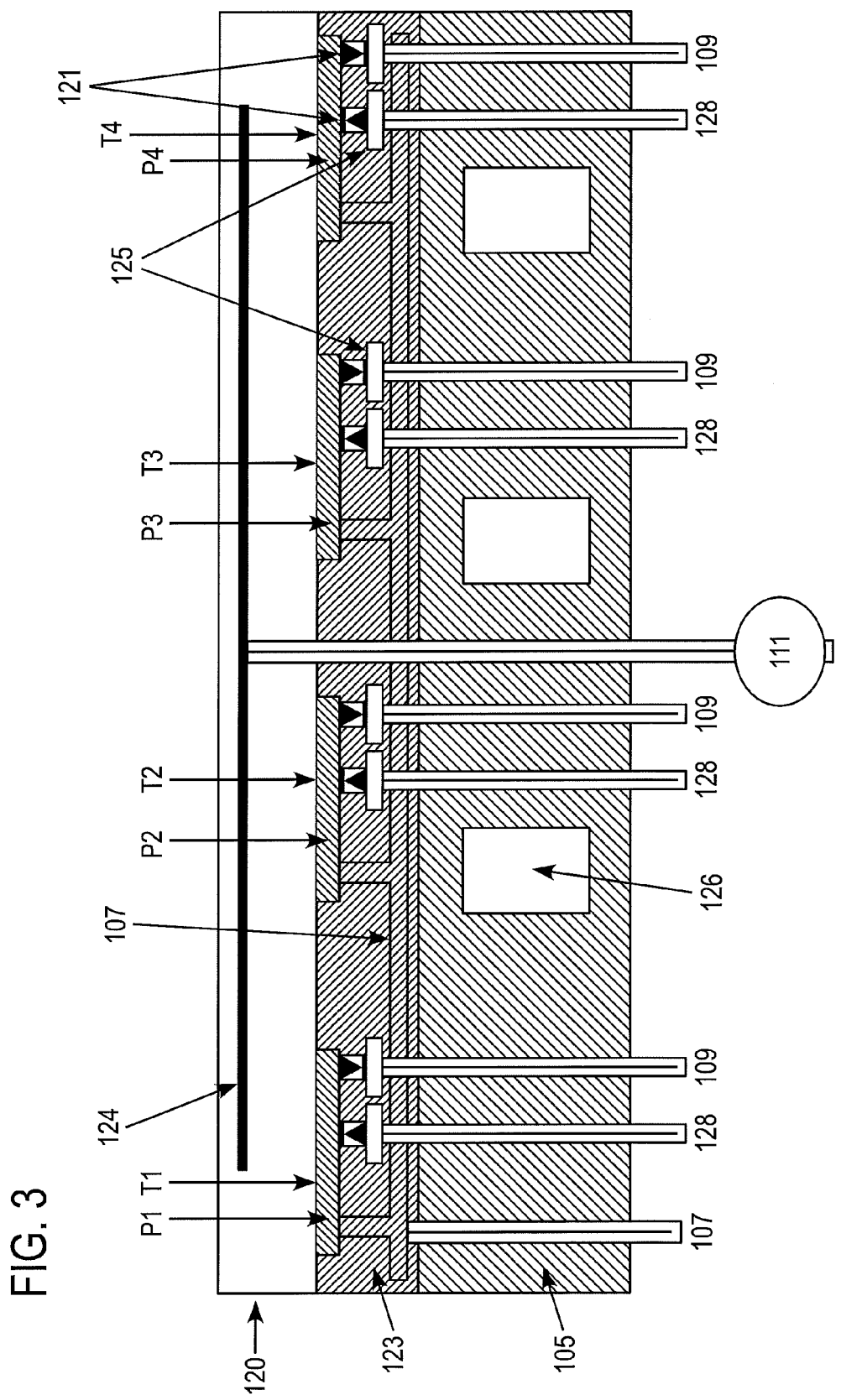
FIG. 3 is a schematic cross-sectional view of a substrate support assembly in which a thermal plate is incorporated, according to a first embodiment.

FIG. 3 shows a substrate support assembly 120 comprising one embodiment of the heating plate having a thermal plate 123. The thermal plate 123 can be made up of one or more layers made of a polymer material, an inorganic material, a ceramic such as silicon oxide, alumina, yttria, aluminum nitride or other suitable material. The substrate support assembly 120 further comprises a dielectric layer including at least one ESC (electrostatic clamping) electrode 124 (e.g. monopolar or bipolar) incorporated in or attached to the thermal plate 123 to electrostatically clamp a substrate to the exposed upper surface of the assembly 120 by applying a DC voltage to the clamping electrode and a cooling plate 105 containing channels 126 for coolant flow is attached to a lower surface of the thermal plate 123. The cooling plate can be maintained at a constant temperature of, for example, −20° C. to +80° C. The substrate support assembly 120 also includes thermal zones T1, T2, T3, T4 incorporated in the thermal plate 123 each of which includes a single thermoelectric Peltier device or module of Peltier elements (P1, P2, P3, P4) connected to a common line 107, a positive voltage line 128 and a negative voltage line 109. Diodes 121 are provided between the lines 128, 109 and the Peltier devices P1, P2, P3, P4. The electrostatic clamping electrode 124 is connected to a clamping voltage supply line 111.

As shown in FIG. 3, each of the planar thermal zones T1, T2, T3, T4 is connected to a positive voltage line 128, a negative voltage line 109 and a common line 107. No two planar thermal zones T1, T2, etc. share the same pair of lines 128/109 and 107. By suitable electrical switching arrangements, it is possible to connect either the positive voltage line 128 or the negative voltage line 109 and one of the common lines 107 to a power supply (not shown), whereby only the planar thermal zone connected to this pair of lines is powered. The time-averaged heating power of each planar thermal zone can be individually tuned by time-domain multiplexing. The diode 121 connected between each planar thermal zone T1, T2, T3, T4 and the positive or negative voltage line does not allow current flow from the planar thermal zone to the inactive voltage line. The diodes 121 can be physically located in the thermal plate or any suitable location. By activating a positive or negative voltage line, heating or cooling of the upper surface of a planar thermal zone can be effected while the opposite side of the Peltier devices is cooled or heated by the cooling plate 105.

Electrical components including the common lines 107, positive voltage lines 128, and negative voltage lines 109 can be arranged in various planes in any suitable order in the thermal plate 123, wherein the planes are separated from each other by an electrically insulating material. Electrical connections between the planes can be made by suitably arranged vertically extending vias. Preferably, the planar thermal zones T1, T2, etc. are arranged closest to the substrate support assembly upper surface. Bus lines 125 connect lines 128, 109 to Peltier devices P1-P4.

Figure 4:
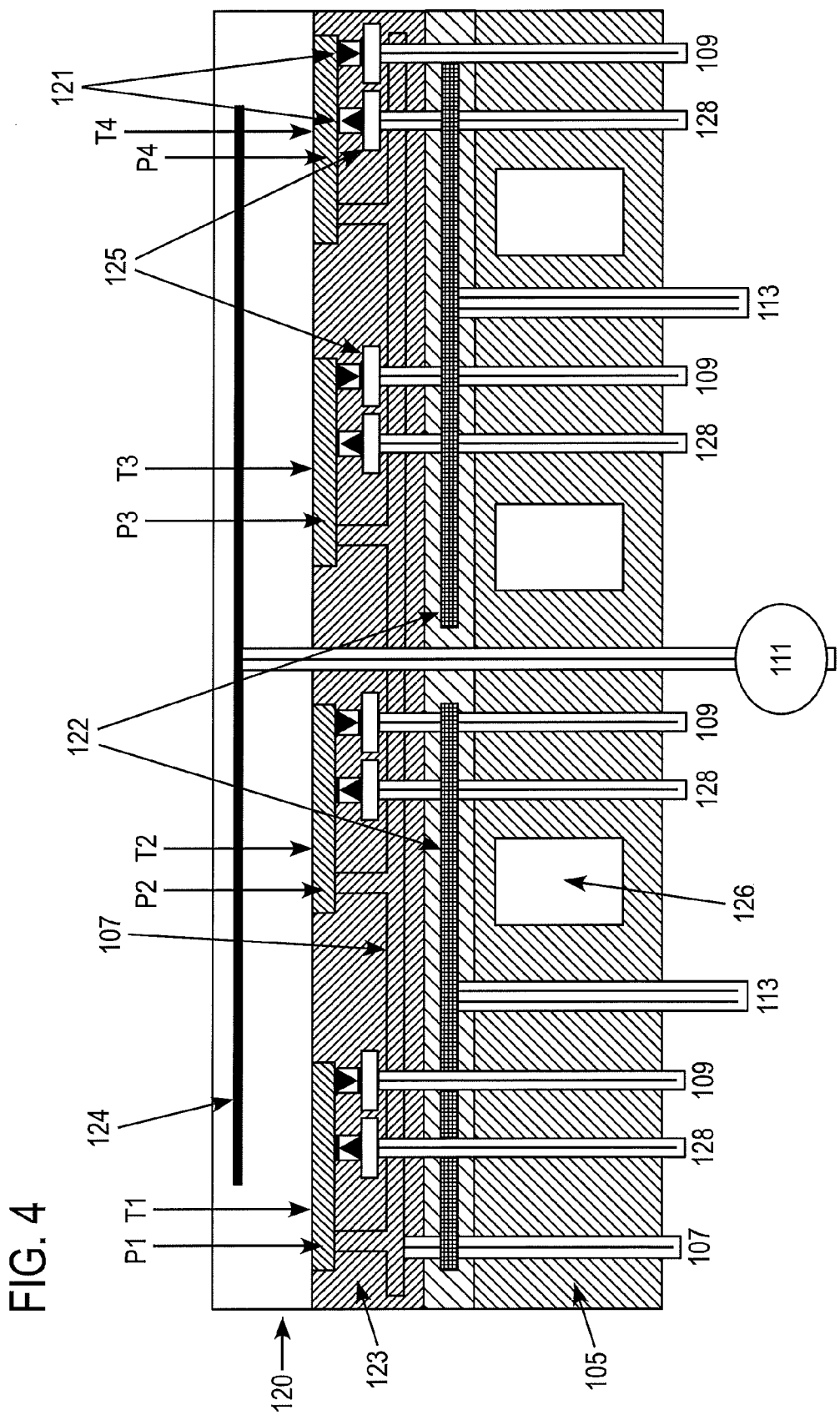
FIG. 4 is a schematic cross-sectional view of a substrate support assembly in which a thermal plate is incorporated, according to a second embodiment.

As shown in FIG. 4, the substrate support assembly 120 can comprise one or more additional heaters 122 (hereafter referred to as primary heaters). Preferably, the primary heaters 122 are individually controlled high-power heaters. The power of each of the primary heaters is between 100 and 10000 W, preferably, between 500 and 2000 W. This power may be delivered by primary heater supply/return lines 113. While only two primary heaters are shown in FIG. 4, the primary heaters may include three or more resistance heaters arranged in a spatial array, e.g., as a rectangular grid, concentric annular zones, radial zone or combination of annular zones and radial zones. The primary heaters 122 may be used for changing the mean temperature, tuning the radial temperature profile, or step-by-step temperature control on the substrate. While the primary heaters 122 may be located below the planar thermal zones 101 of the thermal plate 123 as shown in FIG. 4, the primary heaters may be located above the thermal plate 123 as shown in FIG. 5.

Figure 5:
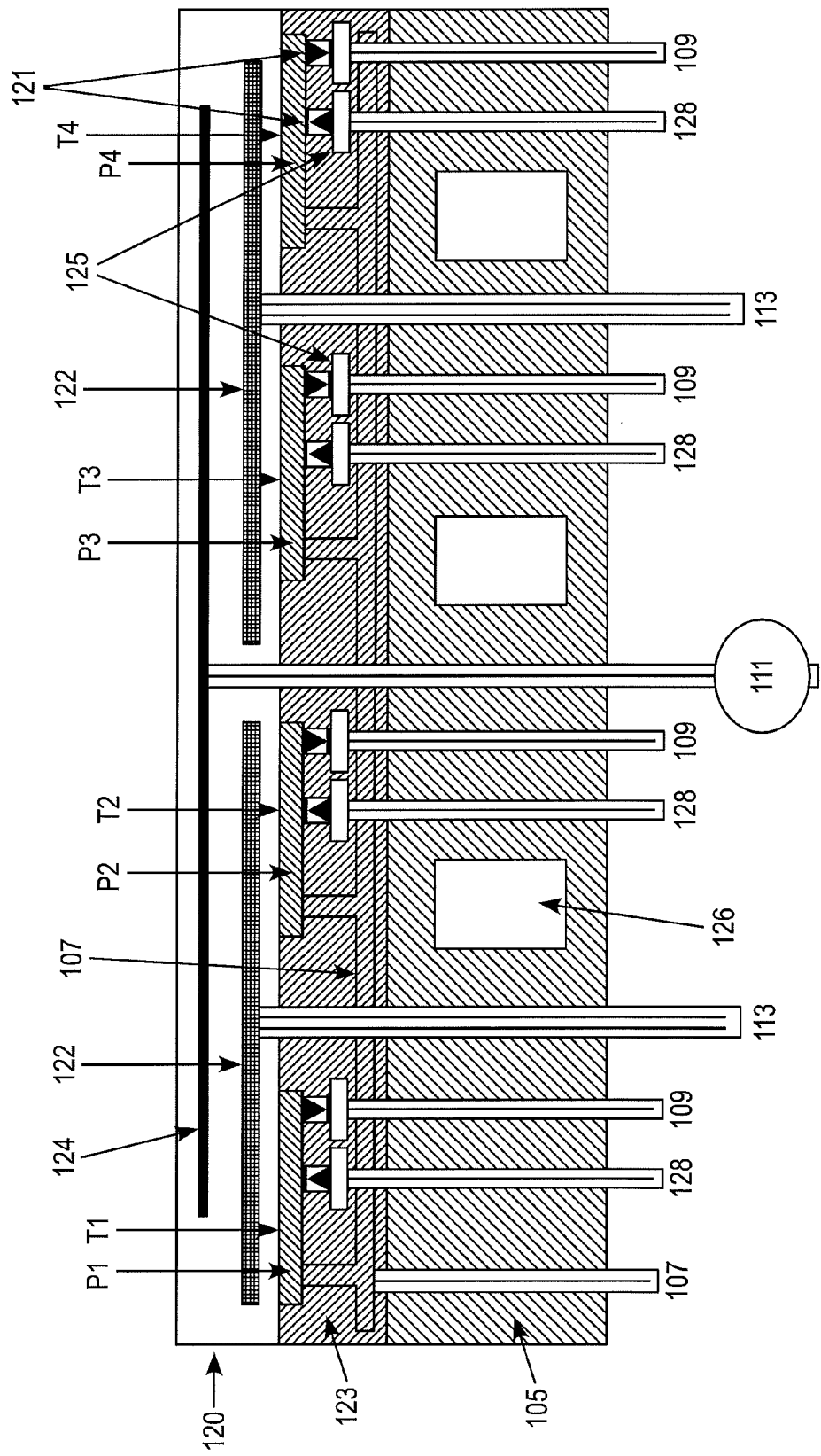
FIG. 5 is a schematic cross-sectional view of a substrate support assembly in which a thermal plate is incorporated, according to a third embodiment.

The thermal plate 123 as shown in FIGS. 3-5 can be made by an exemplary method comprising: pressing a mixture of ceramic powder, binder and liquid into green sheets; drying the sheets; forming vias in the green sheets by punching holes in the sheets; forming the conductor lines on the green sheets by screen printing a slurry of conducting powder (e.g. W, WC, doped SiC or $MoSi_2$), pressing a precut metal foil, spraying a slurry of conducting powder, or any other suitable technique; aligning the sheets; bonding the green sheets by adhesive or sintering the sheets together to form the thermal plate; filling the vias with a slurry of conducting powder; bonding Peltier devices P1, P2, P3, P4 and diodes 121 on the thermal plate such that Peltier devices are connected to the conductor lines 107, 128, 109 such no two Peltier devices in different planar thermal zones share the same pair of lines 128/109 and line 107. Each of the sheets can be about 0.3 mm in thickness.

The thermal plate 123 as shown in FIGS. 3-5 can also be made by another method comprising: (a) bonding (e.g. heat pressed, adhered with adhesive) a metal sheet (such as Al, Inconel® or Cu foil) onto a fiberglass composite plate, or a metal plate covered by an electrically insulating polymer film (e.g. polyimide); (b) applying a patterned resist film to the surface of the metal sheet wherein the openings in the patterned resist film define the shapes and positions of a group of common lines; (c) forming the group of common lines by chemically etching portions of the metal sheet exposed through the openings in the patterned resist film; (d) removing the resist film (by dissolution in a suitable solvent or dry stripping); (e) applying an electrically insulating polymer film on the metal sheet; (f) optionally repeat steps (b)-(e) one or more times; (g) forming vias by punching holes through the metal sheet(s) and the electrically insulating polymer film(s) and filling the holes with a slurry of conducting powder or by plating metal; (h) bonding Peltier devices and diodes, and optionally forming a group of positive and negative voltage lines, onto an exposed surface of another electrically insulating polymer and attaching the sheets together such that Peltier devices in each planar thermal zone are connected to a pair of positive and negative voltage lines and one common line with no two Peltier devices in different planar thermal zones sharing the same pair of positive and negative voltage lines and common line.

When powering a planar thermal zone T1, T2, T3, T4, a DC electrical current is directed through the Peltier device(s) of the planar thermal zone in a desired direction to cause heating or cooling of the thermal zone. Thus, by selecting the direction of the DC electrical current, the planar thermal zone can locally heat or cool a vertically aligned portion of a semiconductor substrate supported on the substrate support assembly.

Examples of suitable insulating and conductive material for use in manufacture of the substrate support assembly are disclosed in commonly assigned U.S. Pat. No. 6,483,690, the disclosure of which is hereby incorporated by reference.

While a heating plate, methods of manufacturing the heating plate, and a substrate support assembly comprising the heating plate have been described in detail with reference to specific embodiments thereof, it will be apparent to those skilled in the art that various changes and modifications can be made, and equivalents employed, without departing from the scope of the appended claims.

We claim:

1. A thermal plate, configured to overlay a temperature controlled base plate of a substrate support assembly used to support a semiconductor substrate in a semiconductor processing apparatus, the thermal plate comprising:
    an electrically insulating plate;
    planar thermal zones comprising at least first, second, third and fourth planar thermal zones, each comprising one or more Peltier devices as thermoelectric elements, the planar thermal zones laterally distributed across the electrically insulating plate and operable to tune a spatial temperature profile on the substrate;
    positive voltage lines comprising first and second electrically conductive positive voltage lines laterally distributed across the electrically insulating plate;
    negative voltage lines comprising first and second electrically conductive negative voltage lines laterally distributed across the electrically insulating plate;
    common lines comprising first and second electrically conductive common lines laterally distributed across the electrically insulating plate;
    first, second, third, fourth, fifth, sixth, seventh and eighth diodes laterally distributed across the electrically insulating plate;
    wherein:
    an anode of the first diode is connected to the first positive voltage line and a cathode of the first diode is connected to the first planar thermal zone;
    an anode of the second diode is connected to the first planar thermal zone and a cathode of the second diode is connected to the first negative voltage line;
    an anode of the third diode is connected to the first positive voltage line and a cathode of the third diode is connected to the second planar thermal zone;

an anode of the fourth diode is connected to the second planar thermal zone and a cathode of the fourth diode is connected to the first negative voltage line;

an anode of the fifth diode is connected to the second positive voltage line and a cathode of the fifth diode is connected to the third planar thermal zone;

an anode of the sixth diode is connected to the third planar thermal zone and a cathode of the sixth diode is connected to the second negative voltage line;

an anode of the seventh diode is connected to the second positive voltage line and a cathode of the seventh diode is connected to the fourth planar thermal zone;

an anode of the eighth diode is connected to the fourth planar thermal zone and a cathode of the eighth diode is connected to the second negative voltage line;

the first common line is connected to both the first and third planar thermal zones; and the second common line is connected to both the second and fourth planar thermal zones.

2. The thermal plate of claim 1, wherein the planar thermal zones do not comprise any resistive heater elements.

3. The thermal plate of claim 1, wherein (a) the Peltier devices of each of the planar thermal zones are located in an upper portion of the electrically insulating plate; the positive voltage and negative voltage lines are disposed below the Peltier devices and electrically connected to the diodes by vias extending vertically in the electrically insulating plate; the common lines are below the positive and negative voltage lines and are electrically connected to the planar thermal zones by vias extending vertically in the electrically insulating plate.

4. The thermal plate of claim 1, wherein the planar thermal zones are sized such that:

(a) each planar thermal zone is not larger than four device dies being manufactured on the semiconductor substrate, (b) each planar thermal zone is not larger than two device dies being manufactured on the semiconductor substrate, (c) each planar thermal zone is not larger than one device die being manufactured on the semiconductor substrate, or (d) each planar thermal zone is scaled with sizes of device dies on the semiconductor substrate and the overall size of the semiconductor substrate.

5. The thermal plate of claim 1, wherein the planar thermal zones are sized such that:

(a) each planar thermal zone is 0.1 to 1 $cm^2$,
(b) each planar thermal zone is 2 to 3 $cm^2$,
(c) each planar thermal zone is 1 to 15 $cm^2$, or
(d) each planar thermal zone is 16 to 100 $cm^2$.

6. The thermal plate of claim 1, wherein the thermal plate includes 16 to 400 planar thermal zones.

7. The thermal plate of claim 1, wherein the electrically insulating plate comprises one or more layers of a polymer material, a ceramic material, a fiberglass composite, or a combination thereof.

8. The thermal plate of claim 1, wherein the total number of positive voltage lines is equal to or less than one half the total number of the planar thermal zones, and/or the total number of the common lines is equal to or less than one half the total number of the planar thermal zones.

9. The thermal plate of claim 1, wherein a total area of the planar thermal zones is from 50% to 100% of an upper surface of the thermal plate.

10. The thermal plate of claim 1, wherein the planar thermal zones are arranged in a rectangular grid, hexagonal grid or polar array; and the planar thermal zones are separated from each other by gaps at least 1 millimeter in width and at most 10 millimeters in width.

11. A substrate support assembly comprising:

an electrostatic chuck (ESC) including at least one electrostatic clamping electrode configured to electrostatically clamp a semiconductor substrate on the substrate support assembly;

an upper side of the thermal plate of claim 1 supporting the ESC; and a temperature controlled base plate attached to a lower side of the thermal plate.

12. The substrate support assembly of claim 11, further comprising at least one primary heater layer arranged above or below the thermal plate, wherein the primary heater layer is electrically insulated from the planar thermal zones, the primary heater layer includes at least one resistance heater which provides mean temperature control of the semiconductor substrate; the planar thermal zones provide radial and azimuthal temperature profile control of the semiconductor substrate, during processing thereof.

13. A method for manufacturing the thermal plate of claim 1, comprising:

pressing a mixture of ceramic powder, binder and liquid into sheets;

drying the sheets;

forming vias in the sheets by punching holes therein;

forming the positive voltage, negative voltage and common lines on the sheets;

aligning the sheets;

bonding the sheets by adhesive or sintering to form the thermal plate;

filling the vias with a slurry of conducting powder;

bonding Peltier devices and diodes onto the thermal plate such that Peltier device(s) in each planar thermal zone are connected to a pair of positive and negative lines and one common line such that no two Peltier devices in different planar thermal zones share the same common line and pair of positive and negative lines.

14. The method of claim 13, wherein the positive, negative and common lines are formed by screen printing a slurry of conducting powder, pressing a precut metal foil, or spraying a slurry of conducting powder.

15. A method for manufacturing the thermal plate of claim 1, comprising:

(a) bonding a metal sheet onto a fiberglass composite plate, or a metal plate covered by an electrically insulating polymer film;

(b) applying a patterned resist film to the surface of the metal sheet wherein the openings in the patterned resist film define the shapes and positions of a group of conductor lines corresponding to positive voltage, negative voltage and/or common lines;

(c) forming the group of conductor lines by chemically etching portions of the metal sheet exposed through the openings in the patterned resist film;

(d) removing the resist film;

(e) applying an electrically insulating polymer film on the metal sheet;

(f) optionally repeat steps (b)-(e) one or more times;

(g) forming vias by punching holes through the metal sheet(s) and the electrically insulating polymer film(s) and filling the holes with at least one of metal, a slurry of conducting powder, conductive adhesive or conductive polymer;

(h) bonding Peltier devices and diodes to one or more electrically insulating polymer films and assembling the films to form the thermal plate such that Peltier devices in each planar thermal zone are connected to a pair of positive and negative lines and one common line and no two Peltier devices in different planar thermal zones share the same common line and pair of positive and negative lines.

16. A method for plasma processing semiconductor substrates in a plasma processing chamber containing the substrate support assembly of claim 11, comprising:
    (a) loading a semiconductor substrate into the processing chamber and positioning the semiconductor substrate on the substrate support assembly;
    (b) determining a temperature profile that compensates for processing conditions affecting critical dimension (CD) uniformity;
    (c) heating the semiconductor substrate to conform to the temperature profile using the substrate support assembly;
    (d) igniting plasma and processing the semiconductor substrate while controlling the temperature profile by independently controlled heating or cooling of the planar thermal zones;
    (e) unloading the semiconductor substrate from the processing chamber and repeating steps (a)-(e) with a different semiconductor substrate.

17. The substrate support assembly of claim 12, wherein the primary heater layer includes two or more heaters.

18. The thermal plate of claim 1, wherein the thermal plate is configured to support an electrostatic clamping layer.

* * * * *